United States Patent
Ikeda et al.

(10) Patent No.: US 10,157,159 B2
(45) Date of Patent: Dec. 18, 2018

(54) SEMICONDUCTOR MEMORY DEVICE, STORAGE SYSTEM, AND COMPUTER

(71) Applicant: HITACHI, LTD., Chiyoda-ku, Tokyo (JP)

(72) Inventors: Yasuhiro Ikeda, Tokyo (JP); Yutaka Uematsu, Tokyo (JP); Hideyuki Koseki, Tokyo (JP); Masato Shimizu, Tokyo (JP); Nobushige Nakajima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 158 days.

(21) Appl. No.: 15/510,486

(22) PCT Filed: Nov. 7, 2014

(86) PCT No.: PCT/JP2014/079529
§ 371 (c)(1),
(2) Date: Mar. 10, 2017

(87) PCT Pub. No.: WO2016/072007
PCT Pub. Date: May 12, 2016

(65) Prior Publication Data
US 2017/0286345 A1  Oct. 5, 2017

(51) Int. Cl.
| | |
|---|---|
| *G06F 13/40* | (2006.01) |
| *G11C 5/06* | (2006.01) |
| *G11C 16/06* | (2006.01) |
| *G11C 16/24* | (2006.01) |
| *G11C 7/10* | (2006.01) |
| *G11C 16/26* | (2006.01) |
| *G06F 12/02* | (2006.01) |
| *G11C 16/04* | (2006.01) |
| *G06F 13/16* | (2006.01) |

(52) U.S. Cl.
CPC ...... *G06F 13/4022* (2013.01); *G06F 13/1684* (2013.01); *G06F 13/4068* (2013.01); *G11C 5/066* (2013.01); *G11C 7/1063* (2013.01); *G11C 16/06* (2013.01); *G11C 16/24* (2013.01); *G11C 16/26* (2013.01); *G06F 12/0246* (2013.01); *G06F 2212/1056* (2013.01); *G06F 2212/263* (2013.01); *G06F 2212/7208* (2013.01); *G11C 16/0483* (2013.01)

(58) Field of Classification Search
CPC ............ G06F 13/4022; G06F 13/1684; G06F 13/4068; G06F 12/0246; G06F 2212/1056; G06F 2212/263; G06F 2212/7208; G11C 5/066; G11C 7/1063; G11C 16/06; G11C 16/24; G11C 16/26; G11C 16/0483
See application file for complete search history.

(56) References Cited

U.S. PATENT DOCUMENTS

| | | |
|---|---|---|
| 6,349,051 B1 | 2/2002 | Klein |
| 2009/0319716 A1 | 12/2009 | Nagadomi |
| 2013/0086305 A1 | 4/2013 | Ishikawa et al. |

FOREIGN PATENT DOCUMENTS

| | | |
|---|---|---|
| JP | 2010-3161 A | 1/2010 |
| WO | WO 2013/046463 A1 | 4/2013 |

*Primary Examiner* — Tim T Vo
*Assistant Examiner* — Herve Iradukunda
(74) *Attorney, Agent, or Firm* — Miles & Stockbridge P.C.

(57) ABSTRACT

A semiconductor memory device includes, in addition to a first switching circuit with which a data system signal line between a plurality of semiconductor memory portions and a memory controller is branched, a second switching circuit with which a non-data system signal line between the plurality of semiconductor memory portions and the memory controller is branched, and the first and second switching circuits share a switching signal line.

11 Claims, 11 Drawing Sheets

SEMICONDUCTOR MEMORY DEVICE, STORAGE SYSTEM, AND COMPUTER

TECHNICAL FIELD

This invention generally relates to connection between a plurality of semiconductor memory portions and a memory controller.

BACKGROUND ART

A nonvolatile memory device (hereinafter, referred to as an NVM device) including a plurality of nonvolatile memory chips (hereinafter, referred to as an NVM chip) has been known as a semiconductor memory device including a plurality of semiconductor memory portion.

Recently, a demand for large capacity storage systems, using NVM devices (for example, flash memory devices) featuring a low cost and high-density packaging, has been increasing. A larger number of NVM chips are required for implementing a larger capacity storage system.

A larger number of NVM chips coupled to a memory controller directly relates to a larger number of signal lines for the NVM chips. Examples of the signal line for the NVM chip include a data system signal line, a chip enable (CE) signal line, and a ready/busy (R/B) signal line. A data system signal is transmitted on the data system signal line. The data system signal includes a command, an address, a write enable (WE), read enable (RE), command latch enable (CLE), address latch enable (ALE), and I/O data (write (program) or read target data). A chip enable (CE) signal for selecting a NVM chip is transmitted on the CE signal line. A ready busy (R/B) signal indicating an operation state of an NVM chip is transmitted on the R/B signal line.

The increase in the number of signal lines for the NVM chip involves at least one of the following problems.
(1) The number of pins of the memory controller increases. This results in an increased size of the memory controller, which might result in an increased cost of the memory controller.
(2) The signal lines occupy a large package occupying area. This results in an increased size of the NVM device (for example, a substrate).
(3) The packaging density of the signal lines increases to render the packaging more difficult. This results in an increased packaging steps and an increased packaging cost.

Thus, the number of signal lines between the plurality of NVM chips and the memory controller is preferably reduced. PTL 1 discloses a technique for achieving a smaller number of signal lines. PTL 1 discloses the following configuration: "a memory system includes a NAND memory incorporating a plurality of chips and a NAND controller 112 that controls the NAND memory. A bus switch is provided that switches the connection of the signal lines between a plurality of chips incorporated in the NAND controller 112 and the NAND memory. Thus, the load capacity of the signal line at the time of accessing the NAND memory 10 can be reduced, whereby a signal delay can be prevented".

CITATION LIST

Patent Literature

[PTL 1]
Japanese Patent Application Laid-open No. 2010-3161

SUMMARY OF INVENTION

Technical Problem

PTL 1 uses the bus switch for the data system signal line so that the number of data system signal lines can be reduced. However, the total number of signal lines needs to be reduced even further. More specifically, in PTL 1, the number of non-data system signal lines (signal lines other than the data system signal lines), at least including the R/B signal lines and the CE signal lines for example, is not reduced.

For example, a plurality of R/B signals, each coupled to a corresponding one of the plurality of NVM chips, may be integrated to reduce the number of R/B signal lines. Unfortunately, this compromises operation multiplicity (the number of NVM chips that can operate in parallel) of the NVM chips, and thus leads to lower performance. Furthermore, a failed R/B signal would be undetectable in this configuration.

The bus switch may be provided also for the non-data system signal lines to reduce the number of non-data signal lines. Unfortunately, simply providing the bus switch for the non-data system signal lines leads to another problem related to signal lines. More specifically, a signal line (switching signal line) for a switching signal, for switching the NVM chip as the coupling destination, is required for each of the bus switch for the data system signal line and the bus switch for the non-data system signal line. Thus, the number of switching signal lines increases.

Semiconductor memory devices other than the NVM device may also be plagued by these problems.

Solution to Problem

To solve the problems described above, configurations described in the appended claims can be employed, for example. An example of means for solving the problems described is as follows.

Specifically, a semiconductor memory device includes, in addition to a first switching circuit with which a data system signal line between a plurality of semiconductor memory portions and a memory controller is branched, a second switching circuit with which a non-data system signal line between the plurality of semiconductor memory portions and the memory controller is branched, and the first and second switching circuits share a switching signal line.

Advantageous Effects of Invention

Not only the number of data system signal lines but also the number of non-data system signal lines can be reduced without increasing the number of switching signal lines. Thus, the number of pins of the memory controller can be reduced, and the package occupying area or the packaging density of the signal lines can be reduced.

DESCRIPTION OF EMBODIMENTS

Figure 1:
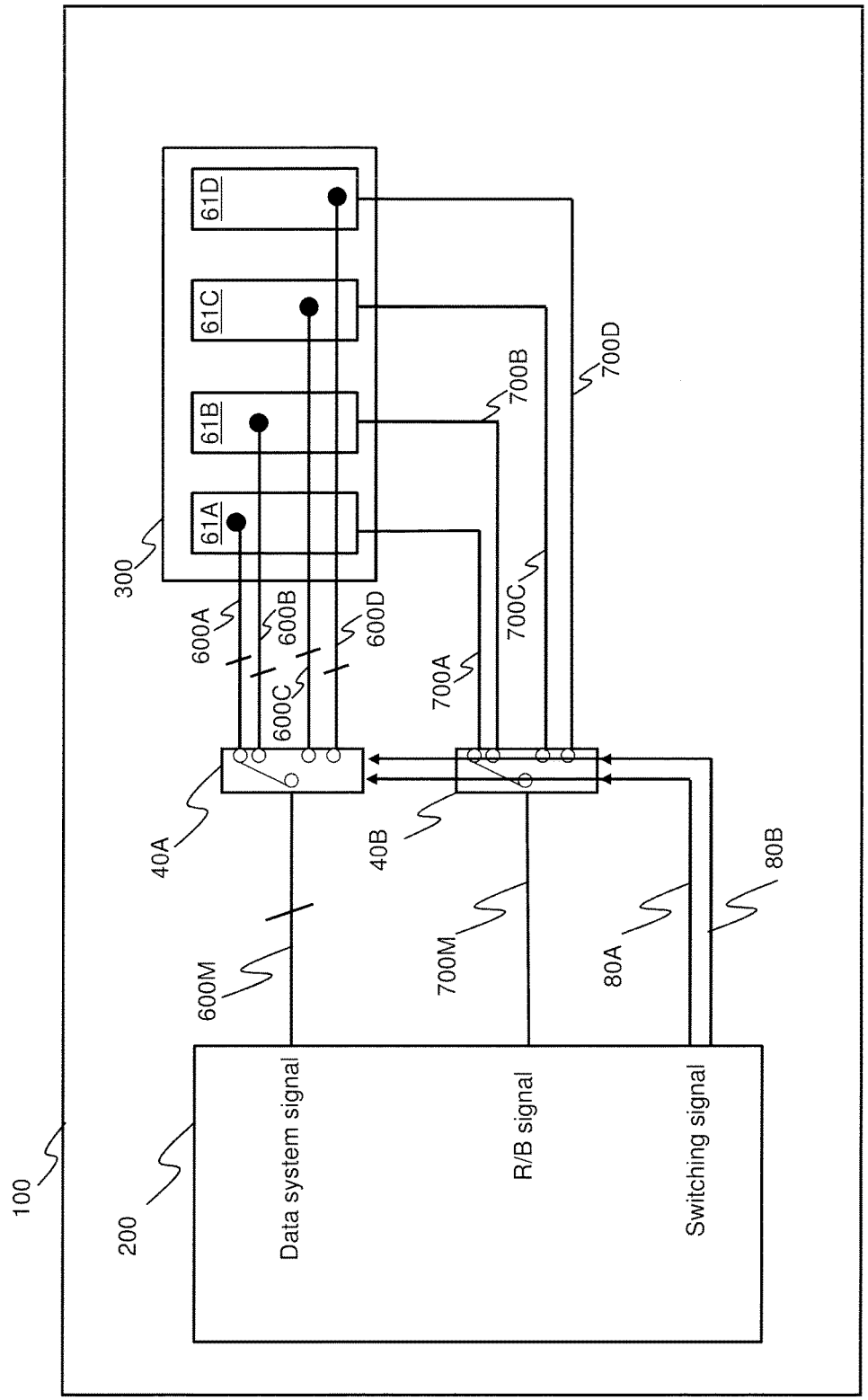
FIG. 1 illustrates an overview of an NVM device according to Embodiment 1.

Some embodiments are described below with reference to the drawings. A semiconductor memory device in the embodiments described below is an NVM device. Alternatively, the present invention may be applied to a semiconductor memory device other than the NVM device (semiconductor memory other than the NVM).

In the following description, individual reference numerals of the same types of components may be referred to in order to describe them in a distinguished manner, whereas only apart of the reference numerals common to them may be referred to in order to describe them without distinguishing one from another. For example, "chip 61" is referred to in order to describe chips (dies) without distinguishing one from another, whereas "chip 61A" and "chip 61B" are referred to in order to distinguish one from another.

[Embodiment 1]

FIG. 1 illustrates an overview of an NVM device according to an Embodiment 1.

An NVM device (for example, a substrate) 100 includes an NVM controller (hereinafter, referred to as a controller) 200 and an NVM 300.

The controller 200 is an example of a memory controller, and controls writing (programing) of data to the NVM 300 and reading of data from the NVM 300. For example, the controller 200 transmits a data write (program) command or a data read command to the NVM 300. Data write/read (write or read) may be performed in response to an I/O request from an upper level device (not illustrated) or without the I/O request from the upper level device. For example, write/read performed without the I/O request from the upper level device is write/read performed in internal processing such as reclamation processing or refresh processing. The controller 200 includes a plurality of pins 181. Each signal line is coupled to two or more pins 181 in the plurality of pins 181. The controller 200 may be any one of an FPGA (Field Programmable Gate Array), an ASIC (Application Specific Integrated Circuit), a CPU (Central Processing Unit), and a GPU (Graphics Processing Unit). The "upper level device" of the NVM device 100 may be any type of device that transmits an I/O request to the NVM device 100. For example, when the NVM device 100 is used as an external storage device for a computer, the upper level device may be the computer. When the NVM device 100 is used as a storage device embedded in a computer, the upper level device may be a processor (for example, a CPU) in the computer. When the NVM device 100 is used as a storage device in a storage system, the upper level device maybe a storage controller in the storage system.

The NVM 300 is an example of a semiconductor memory, and includes two or more (for example, four) NVM chips (dies) 61. The NVM chip (hereinafter, simply referred to as "chip" in some cases) 61 is an example of an NVM portion. The NVM 300 uses a data system signal and also uses a non-data system signal such as an R/B signal, and may be, for example, any one of a flash memory, a PRAM (Phase Change Random Access Memory), an ReRAM (Resistance Random Access Memory), and an FeRAM (Ferroelectric Random Access Memory). In the present embodiment, the NVM 300 is a flash memory (for example, a NAND flash memory).

In the present embodiment, the controller 200 and the NVM 300 are coupled to each other in 1 to 1 relationship. However, the present invention is not limited to this configuration, and a configuration may be employed in which the controller 200 and the NVM 300 are coupled to each other in 1 to n (n being any integer of 1 or more) relationship.

A signal line that couples the controller 200 to the NVM 300 includes a data system signal line and a non-data system signal line. An R/B (ready/busy) signal line is illustrated as the non-data system signal line. The R/B signal line indicates a signal representing an operation state of the chip 61. The R/B signal according to the present embodiment is a 4-bit signal. In the present embodiment, other types of non-data system signal lines are not integrated by a switching circuit or the like. For example, four chip enable (CE) signal lines may each be coupled to a corresponding one of four chips 61A to 61D and to the controller 200.

A first switching circuit 40A and a second switching circuit 40B are provided between the controller 200 and the NVM 300. A data system signal line 600M from the controller 200 is branched by the first switching circuit 40A into four data system signal lines 600A to 600D that are respectively coupled to the four chips 61A to 61D. Similarly, an R/B signal line 700M from the controller 200 is branched by the second switching circuit 40B into four R/B signal lines 700A to 700D that are respectively coupled to the four chips 61A to 61D. In the present embodiment, the switching circuits 40A and 40B are each a (1:m) branching switching circuit (m being an integer of 2 or more), with m not being limited to 4.

The controller 200 also has a switching signal line 80. A signal for controlling a coupling destination of the switching circuit 40, as a switching signal input to the switching circuit 40, is transmitted on the switching signal line 80. The first and second switching circuits 40A and 40B share the switching signal line 80 (switching signal). Thus, the same switching signal is input to both the first and second switching circuits 40A and 40B. This means that the switching of the coupling destination of one of the first and second switching circuits 40A and 40B leads to (for example, at the same time causes) the switching of the coupling destination of the other one of the first and second switching circuits 40A and 40B to the same chip. In other words, a single switching of the coupling destination of the controller 200 involves switching of both the switching circuits 40A and 40B corresponding to the same switching signal line. A single switching signal with two types (ON/OFF) of a signal level can cover a 1:2 branching switching circuit. In the present embodiment, the switching circuit 40 is a 1:4 branching switching circuit. Thus, two switching signals are input to a single switching circuit 40 (two switching signal lines 80A and 80B are coupled to a single switching circuit 40).

An overview of an example of signal transmission (transmission of the data system signal and the R/B signal) according to Embodiment 1 is described.

First of all, the controller 200 sequentially switches the coupling destination of the second switching circuit 40B, and receives the R/B signal from each of the chips 61A to 61D. Thus, the controller 200 checks whether the operation state of each of the chips 61A to 61D is a ready state (a state of waiting for a command from the controller 200).

A case where the transmission destination chip 61 for the data system signal is the chip 61A is described. The controller 200 uses a CE signal line of the transmission destination chip 61A to select the transmission destination chip 61A. The controller 200 uses the switching signal to switch the coupling destination of the first switching circuit 40A to the transmission destination chip (selected chip) 61. Then, the controller transmits the data system signal.

When the coupling destination of the first switching circuit 40A switches to the transmission destination chip 61A, the coupling destination of the second switching circuit 40B is also switched to the transmission destination chip 61A, because the first and second switching circuits 40A and 40B share the switching signal. Thus, in a period in which the coupling destination of the first switching circuit 40A is the transmission destination chip 61A, only the R/B signal of the transmission destination chip 61A, from among the R/B signals of the chips 61A to 61D, is input to the controller 200. Thus, the R/B signals of the chips 61B to 61D, different from that of the transmission destination chip 61A, are not input to the controller 200.

Thus, after the data transmission to the transmission destination chip 61A, the controller 200 checks whether the operation state of the transmission destination chip 61A has transitioned from the ready state to a busy state (a state where the NVM 300 is processing data). In other words, after the data transmission to the transmission destination chip 61A, the controller 200 waits until the operation state of the transmission destination chip 61A transitions from the ready state to the busy state. After confirming that the busy state has been achieved, the controller 200 can perform a similar transmission to any one of the other chips 61B to 61D. For example, in a flash memory, a time period required for checking the R/B signal of a single chip 61 is sufficiently shorter (several tens of nanoseconds (ns)) than an operation time period of the chip 61 (for example, a read operation (for example, several tens to hundreds of microseconds (μs)), a program operation (several milliseconds (ms)), and an erase operation (for example, several ms)). Thus, a bus occupation time period (more specifically, a time period in which an operation state checking target chip is selected as the coupling destination, and thus the other chips cannot be selected) is short. Thus, the common switching signal can be used without largely compromising the performance.

As illustrated in FIG. 1, in the present embodiment, R/B signal lines 700 between the NVM 300 and the second switching circuit 40B are independently provided to respective chips 61. More specifically, the R/B signal lines 700A to 700D independent from each other and extending from the chips 61A to 61D are coupled to the second switching circuit 40B respectively. Thus, the operation state of each chip 61 can be checked with an oscilloscope or the like, whereby maintainability and reliability of the NVM device 100 can be ensured. The NVM 300, which is a flash memory for example, has a risk that a voltage value of the R/B signal not operating properly might be fixed. Thus, it may be important that the state of each R/B signal can be checked in terms of maintainability and reliability. In view of this, the controller 200 may include a timer circuit for measuring an elapsed time period after the transition of the signal level of the R/B signal. When the elapsed time period exceeds a predetermined time period with no transition of the signal level of the R/B signal detected, the controller 200 may determine that the failure has occurred and report the failure.

Figure 2:
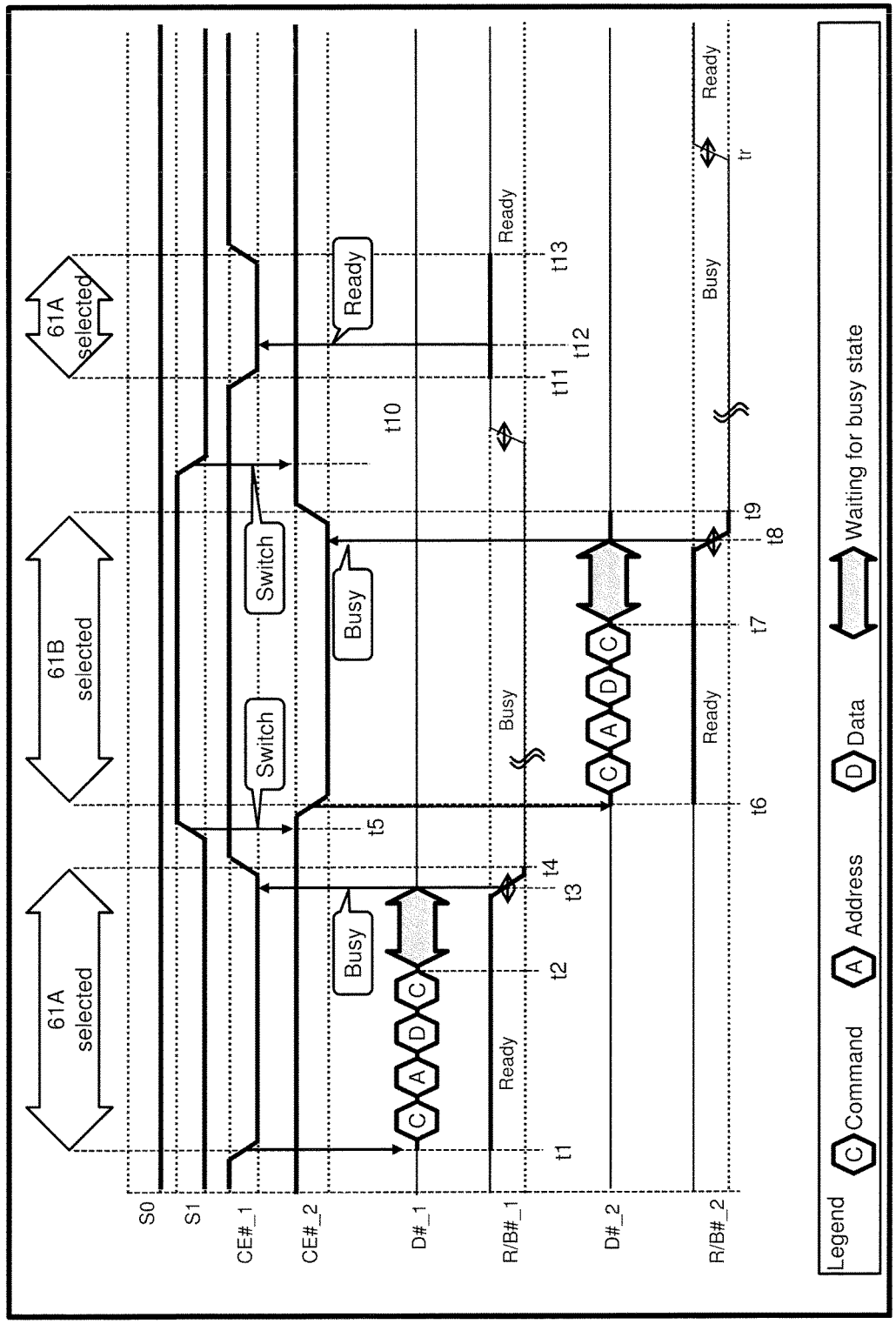
FIG. 2 illustrates an example of a timing chart related to write processing (program processing).

FIG. 2 is an example of a timing chart related to write processing (program processing).

FIG. 2 is based on the following condition. The two chips 61A and 61B are each a write processing target (transmission destination chip (write target chip)). In FIG. 2, a first switching signal transmitted through the first switching signal line 80A is denoted with "S0", and a second switching signal transmitted through the second switching signal line 80B is denoted with "S1". In FIG. 2, a CE signal for the chip 61A is denoted with "CE#_1", and a CE signal for the chip 61B is denoted with "CE#_2". In FIG. 2, a data system signal for the chip 61A is denoted with "D#_1", and a data system signal for the chip 61B is denoted with "D#_2". In FIG. 2, an R/B signal from the chip 61A is denoted with "R/B#_1", and an R/B signal from the chip 61B is denoted with "R/B#_2".

For example, the operation state of each chip 61 is not recognized by the controller 200 in the initial state after being started for the first time or being restarted. Thus, the controller 200 may execute initial check processing for checking the operation state of each chip 61. In the initial check processing, the controller 200 sequentially switches the coupling destination of the switching circuits 40A and 40B, and selects the coupling destination chip 61 with the CE signal, and thus receives the R/B signal from the chip 61. Thus, the controller 200 recognizes the operation state of each chip 61. Through this initial check processing, the controller 200 can detect that the operation state of each of the chips 61A to 61D is the ready state. Instead of executing the initial check processing involving all the chips with the common switching signal, the initial check processing may be executed on a chip-by-chip basis. The initial check processing on the chip-by-chip basis may be executed on a chip the operation state of which has not been detected. The initial check processing for a chip may be executed when the chip becomes a write/read target for the first time, before the write/read is performed.

An example is described where the transition of the operation state of the chip 61A, which has been detected as being in the busy state, to the ready state has not been detected. In such a case, the controller 200 performs ready return check processing on the chip 61A. Specifically, for example, the controller 200 selects the chip 61A by using the CE signal (CE#_1) for the chip 61A. When the chip 61A is not the coupling destination of the switching circuits 40A and 40B, before (or after) the chip 61A is selected, the switching signal for the chip 61A is used (for example, by setting the signal level of each of the first and second switching signals (S0 and S1) to Low level), and the coupling destination of the switching circuits 40A and 40B is switched to the chip 61A. When the chip 61A is the coupling destination of the switching circuits 40A and 40B and is in the selected state, the controller 200 can receive the R/B signal from the chip 61A. When the R/B signal (R/B#_1) from the chip 61A indicates the ready state, the controller 200 can detect that the chip 61A is in the ready state.

When the chip 61A has been detected to be in the ready state, the controller 200 can write data to the chip 61A. Specifically, the controller 200 uses the CE signal (CE#_1) for the chip 61A (sets the signal level of CE#_1 to Low level) to select the chip 61A (time point t1). Then, the controller 200 transmits a required data system signal (for example, command, address, and, write target data) to the chip 61A. Then, the controller 200 waits until the operation state of the chip 61A transitions to the busy state (time point t2 to time point t3). In other words, the controller 200 maintains the state in which the chip 61A is selected until the operation state of the chip 61A transitions to the busy state (does not cancel the selected state). Thus, the controller 200 does not switch the coupling destination of the switching circuits 40A and 40B (the chip 61A remains to be the coupling destination).

When the busy state of the chip 61A is detected from. the R/B signal from the chip 61A (time point t3), the controller 200 uses the CE signal (CE#_1) for the chip 61A to cancel the selection of the chip 61A (time point t4).

After the selection of the chip 61A is cancelled (after the time point t4), the ready state may have been detected as the operation state of the chip 61B in, for example, detection may have been already made in the initial check processing or in the ready return check processing for the chip 31B. In such a case, the controller 200 can write data to the chip 61B. Specifically, the controller 200 first uses the switching signal (for example, sets only the signal level of the second switching signal (S1) as one of the first and second switching signals (S0 and S1) to High level) to switch the coupling destination of the switching circuits 40A and 40B to the chip 61B (time point t5). Then, the controller 200 uses the CE signal (CE#_2) for the chip 61B, (sets the signal level of the CE#_2 to Low level) to select the chip 61B (time point t6). Then, the controller 200 transmits a required data system signal (for example, command, address, and write target data) to the chip 61B. Then, the controller 200 waits until the operation state of the chip 61B transitions to the busy state (time point t7 to time point t8). In other words, the controller 200 maintains the state where the chip 61B is selected (does not cancel the selected state) until the operation state of the chip 61B transitions to the busy state. Thus, the controller 200 does not switch the coupling destination of the switching circuits 40A and 40B (the chip 61B remains to be the coupling destination). When the busy state of the chip 61B is detected from the R/B signal from the chip 61B (time point t8), the controller 200 uses the CE signal (CE#_2) for the chip 61B to cancel the selection of the chip 61B (time point t9).

The controller 200 needs to receive the R/B signal from the transmission destination chip 61 again, for recognizing that the operation of the transmission destination chip 61 has ended (the operation state has returned to the ready state from the busy state). For receiving the R/B signal from the transmission destination chip 61 again, the coupling destination of the switching circuits 40A and 40B needs to be switched to the transmission destination chip 61 and the transmission destination chip needs to be selected by using the CE signal for the transmission destination chip 61. Thus, the ready return check processing described above needs to be executed on the transmission destination chip 61.

An example is described in which the returning of the operation state of the chip 61A, which has been detected to be the busy state at the time point t3, to the ready state has not been detected by the controller 200. In such a case, the controller 200 executes the ready return check processing, described above, on the chip 61A.

Specifically, for example, the chip 61A is not in the selected state with the coupling destination of the switching circuits 40A and 40B being the other chip 61B. Thus, the controller 200 first uses the switching signal to switch the coupling destination of the switching circuits 40A and 40B to the chip 61A (time point t10). Then, the controller 200 uses the CE signal (CE#_1) for the chip 61A to select the chip 61A (time point t11). Thus, the controller 200 can receive the R/B signal from the chip 61A. When the R/B signal indicating the ready state is received (time point t12), the controller 200 checks whether the R/B signal indicates the ready state. When the ready state is detected with the R/B signal, the controller 200 uses the CE signal (CE#_1) for the chip 61A to cancel the selection of the chip 61A (time point t13), because the returning to the ready state of the chip 61A is detected.

The timing chart in FIG. 2 is as described above.

The controller 200 may cancel the selection of the chip 61A, when the R/B signal indicating the ready state is not received for a predetermined time period after the chip 61A has been selected (from the time point t11) in the ready return check processing executed on the chip 61A.

For example, the controller 200 may execute the ready return check processing on the chip 61A when at least one of the following conditions is satisfied:
(A) the CE signals for all of the other chips 61B to 61D, corresponding to the same switching signals as the chip 61A, are in a selection cancel state (not in the selected state) (for example, not waiting for the busy state);
(B) none of the other chips 61B to 61D, corresponding to the same switching signals as the chip 61A, is a write/read target corresponding to an unprocessed I/O request accumulated in the controller 200 (for example a queue); and
(C) the chip 61A is the write/read target corresponding to the unprocessed I/O request accumulated in the controller 200.

For example, in a case where the chip 61A may not be the write/read target corresponding to the unprocessed I/O request accumulated in the controller 200 and moreover any one of the other chips 61B to 61D, corresponding to the same switching signals as the chip 61A, may be the write/read target corresponding to the unprocessed I/O request accumulated in the controller 200, then the controller 200 may prioritize the write, read, or ready return check processing on the chip as the write/read target, over the ready return check processing on the chip 61A.

For example, the controller 200 may include a volatile or a nonvolatile storage area storing configuration information that may indicate association between a switching signal and the switching circuits and the chips the switching signal for which is the same. Thus, the controller 200 may identify two or more chips 61 and two or more switching circuits 40 corresponding to the same the switching signal, based on the configuration information.

Figure 3:
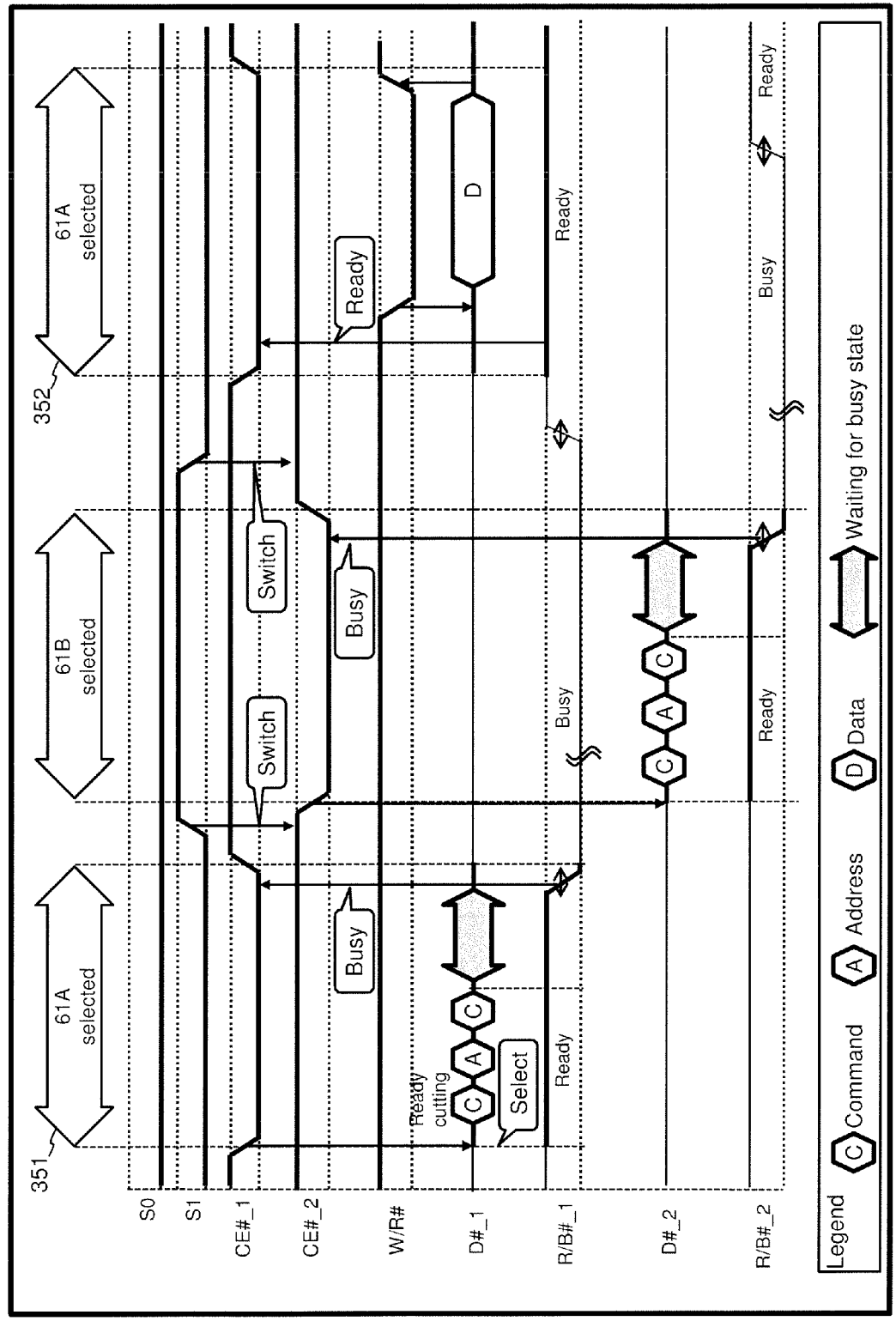
FIG. 3 illustrates an example of a timing chart related to read processing.

FIG. 3 illustrates an example of a timing chart related to read processing.

This figure is based on conditions similar to those for FIG. 2. For example, the two chips 61A and 61B are each a target (transmission destination chip (read target chip)) of the read processing. In FIG. 3, "W/R#" representing a W/R signal (write enable signal/read enable signal) not illustrated in FIG. 2, is additionally provided.

For example, FIG. 3 is different from FIG. 2 in the following point.

Specifically, selection/selection canceling for the chip 61 needs to be performed only once in the write processing on the chip 61, but needs to be performed for a plurality of times in the read processing on the chip 61.

More specifically, for example, a first selected period 351 of the chip 61A starts when the chip 61A is selected. A data system signal transmitted in the first selected period 351 does not include data on a read target. In the first selected period 351, the controller 200 transmits a data system signal, including a command and an address and including no read target data, and waits for the busy state. When the busy state of the chip 61A is detected, the selection of the chip 61A is cancelled. Thus, the first selected period 351 ends.

Then, a second selected period 352 starts when the chip 61A is selected again. When the ready state of the chip 61A is detected in the second selected period 352, the controller 200 uses the W/R signal (W/R#) to receive the read target data from the chip 61A. After the read target data has been successfully received, the selection of the chip 61A may be cancelled by the controller 200. When the ready state is not detected for a predetermined time period after the second selected period 352 has started, the controller 200 may cancel the selection of the chip 61A to end the second selected period 352. Thereafter, the selected period related to the read processing on the chip 61A may be repeated until the ready state is detected.

The timing chart in FIG. 3 is as described above.

The following description can be made based on FIG. 2 and FIG. 3, with the chip 61A as an example. The ready return check processing on the chip 61A is executed regardless of whether the processing executed immediately before is the write processing, or the first part of the read processing (a processing section involving the transmission of the data system signal including no read target data).

The following processing is executed when the write processing is the previous processing executed immediately before the ready return check processing on the chip 61A. Specifically, when the ready state is detected in the ready return check processing, the controller 200 cancels the selection of the chip 61A.

The following processing is executed when the first part of the read processing is the processing executed immediately before the ready return check processing on the chip 61A. Specifically, when the ready state is detected in the ready return check processing, the controller 200 uses the W/R signal to receive the read target data from the chip 61A, and then cancels the selection of the chip 61A.

As described above, the ready return check processing on the chip 61A is different between the case where the processing executed immediately before ready return check processing is the write processing and the case where the processing executed immediately before ready return check processing is the first part of the read processing.

Embodiment 1 is as described above. In Embodiment 1, the switching circuit for the CE signal line may be provided instead of the switching circuit for the R/B signal line. Thus, the switching circuit for the data system signal and the switching circuit for the CE signal line may share the switching signal.

In Embodiment 1, not only the switching circuit 40A for the data system signal, but also the switching circuit 40B for the R/B signal is provided, and the switching circuits 40A and 40B share the switching signal. Thus, not only the number of data system signal lines 600, but also the number of R/B signal lines 700 can be reduced, without increasing the number of switching signal lines 80. Thus, the number of pins 181 of the controller 200 can be reduced, and the package occupation area or a packaging density of the signal line can be reduced.

In Embodiment 1, the switching circuit using the same switching signal as the switching circuit 40A for the data system signal does not correspond to a transmission system signal (a signal transmitted from the controller 200) such as a data system signal, and corresponds to a reception system signal such as an R/B signal (an example of a signal for notifying the operation state of a chip). Thus, the common switching signal is used for the transmission system and the reception system. This means that transmission of a switching signal, for establishing connection with the transmission destination chip for the data system signal might lead to connection to a chip other than a chip from which the R/B signal is to be received. In other words, a common line is used for the R/B signal line and for a bus.

Thus, in Embodiment 1, the controller 200 waits for the busy state after the data system signal is transmitted to the chip (for example, 61A) in the ready state. Then, the coupling destination can be switched from the chip 61A to another chip (for example, 61B) after the busy state of the chip 61A is detected. The coupling destination may be switched to the other chip 61B before the busy state of the chip 61A is detected. However, in such a case, when the coupling destination is switched again to the chip 61A and the ready state is detected, it cannot be determined whether the ready state is achieved by returning from the busy state, or has been unchanged with no transitioning to the busy state. All things considered, with the waiting for the busy state, the degradation of the reliability can be prevented in Embodiment 1.

In Embodiment 1, the initial check processing or the ready return check processing described above is executed. The time period required for checking the ready state is sufficiently shorter than, for instance, the time period required for read and the time period required for write (program) as described above. Thus, the performance is not largely compromised even when the common switching signal is used for the switching circuit 40A for the data system signal and the switching circuit 40B for the R/B signal.

[Embodiment 2]

Embodiment 2 is described. The difference from Embodiment 1 is mainly described, and the points that are the same as Embodiment 1 are not described or briefly described.

Figure 4:
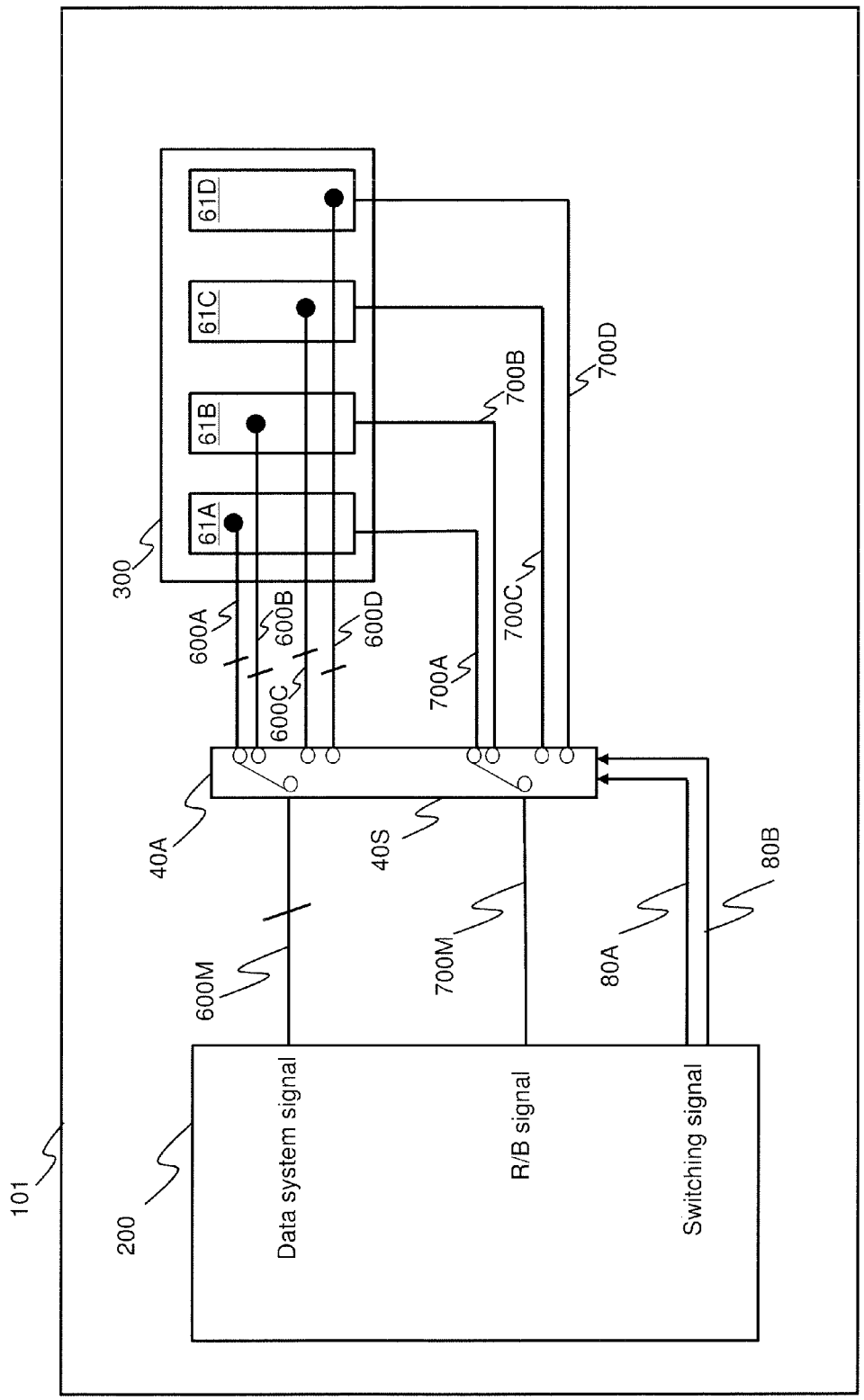
FIG. 4 illustrates an overview of an NVM device according to Embodiment 2.

FIG. 4 illustrates an overview of an NVM device according to Embodiment 2.

In an NVM device 101 according to Embodiment 2, a common (single) switching circuit 40S serves as the switching circuit 40A for the data system signal and the switching circuit 40B for the R/B signal. In other words, the switching circuits 40A and 40B are each a part of the single switching circuit 40S. The switching circuit 40S also corresponds to (1:m) branching with m not being limited to 4.

In Embodiment 2, a package occupying area of the switching circuit can be reduced, and the number of components mounted on the NVM device 101 can be reduced. Thus, improvement of the maintainability of the NVM device 101 can be expected.

The size of the switching circuit 40S may be the same as that of each of the switching circuits 40A and 40B. For example, the switching circuits 40A, 40B and 40S may be the same parts. Specifically, for example, each of the switching circuits 40A and 40B may include an unused port (pin). More specifically, for example, the switching circuit 40A may include enough unused ports for coupling the R/B signal lines 700M and 700A to 700D. Thus, the switching circuit 40A may have the unused port coupled to the R/B signal lines 700M and 700A to 700D to implement the switching circuit 40S according to Embodiment 2. Thus, when the single switching circuit 40S is coupled to a signal line for a transmission system signal such as the data system signal and a signal line for a reception system signal such as the R/B system signal, the common switching signal is used for the transmission system signal line and the reception system signal line. When the common switching signal is used in the transmission system signal line and in the reception system signal line, the problem described in Embodiment 1 occurs. Still, such a problem is solved in Embodiment 1, and thus, the problem caused by coupling the transmission system signal line and the reception system signal line to the single switching circuit 40S, as in Embodiment 2, has been solved.

[Embodiment 3]

Embodiment 3 is described. The difference from Embodiment 1 is mainly described, and the points that are the same as Embodiment 1 are not described or briefly described.

Figure 5:
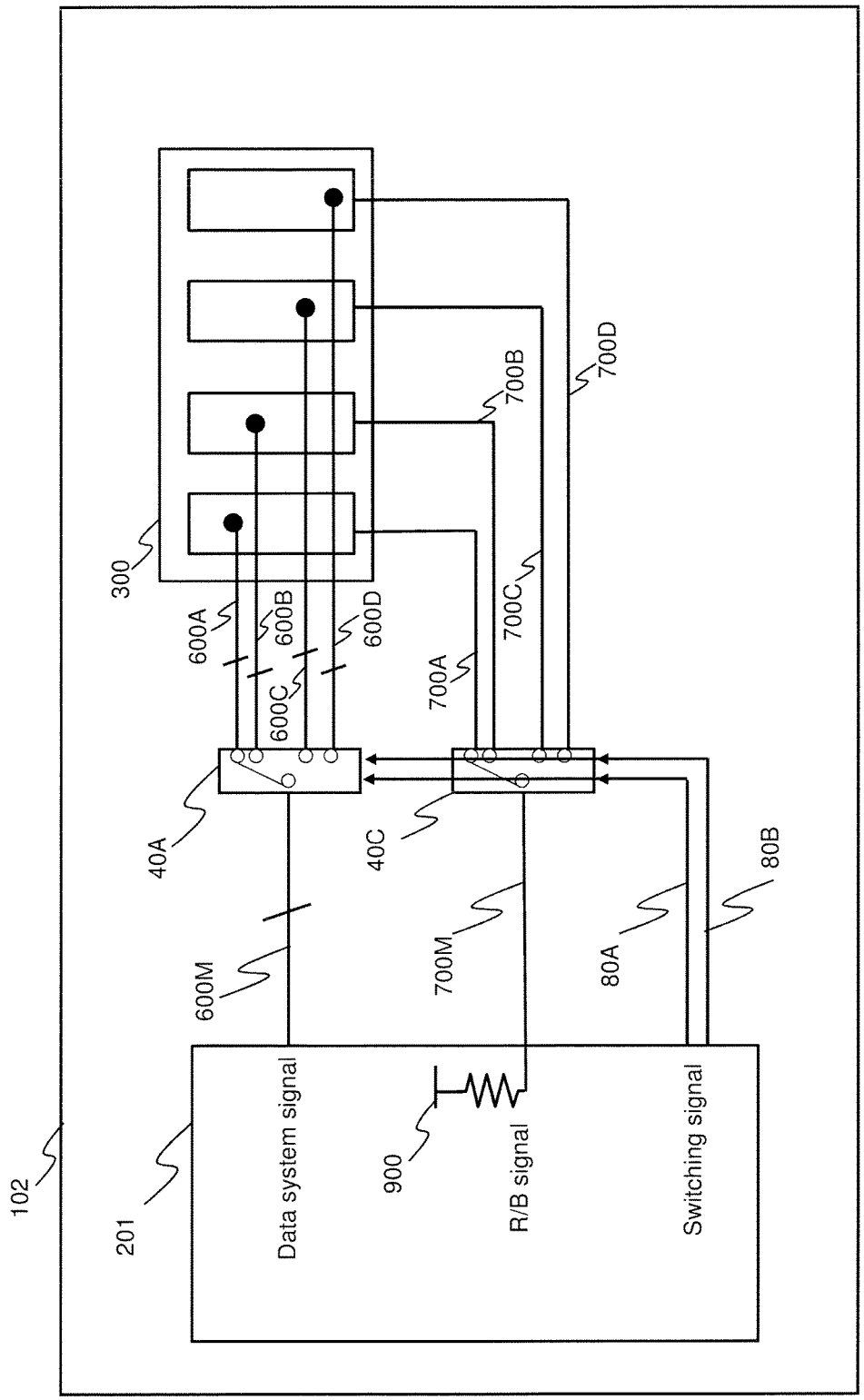
FIG. 5 illustrates an overview of an NVM device according to Embodiment 3.

FIG. 5 illustrates an overview of an NVM device according to Embodiment 3.

In an NVM device 102 according to Embodiment 3, at least a second switching circuit 40C is an analog switching circuit, and a pullup resistor 900 for an R/B signal is incorporated in a controller 201.

With the analog switching circuit, input/output of an analog signal can be performed, and input/output of a digital signal (1 or 0) cannot be performed. The R/B signal is an open drain output, and thus requires the pullup resistor outside the NVM 300. However, when the second switching circuit 40C is the analog switching circuit, the pullup resistor needs not to be provided to each of the R/B signal lines 700A to 700D. When the second switching circuit 40C is a digital switching circuit, the pullup resistor may be required for each signal line coupled to the digital switching circuit so that which one of 1 or 0 (input value) is indicated by the input signal can be clearly recognized. If the second switching circuit 40C is the analog switching circuit, the pullup resistor 900 may be provided to a single R/B signal line 700M (the R/B signal line 700M coupled to the controller 201) that may be coupled to each of the R/B signal lines 700A to 700D. Thus, the number of the pullup resistors can be reduced compared with a case where the pullup resistor is provided to each of the R/B signal lines 700A to 700D. As a result, the package occupying area and the packaged number of pullup resistors can be reduced.

In the switching circuit including the switching circuit 40A for the data system signal and the switching circuit 40C for the R/B signal independently provided, the switching circuit 40A may be a digital switching circuit, whereas the switching circuit 40C may be an analog switching circuit.

[Embodiment 4]

Embodiment 4 is described. The difference from Embodiment 1 is mainly described, and the points that are the same as Embodiment 1 are not described or briefly described.

Figure 6:
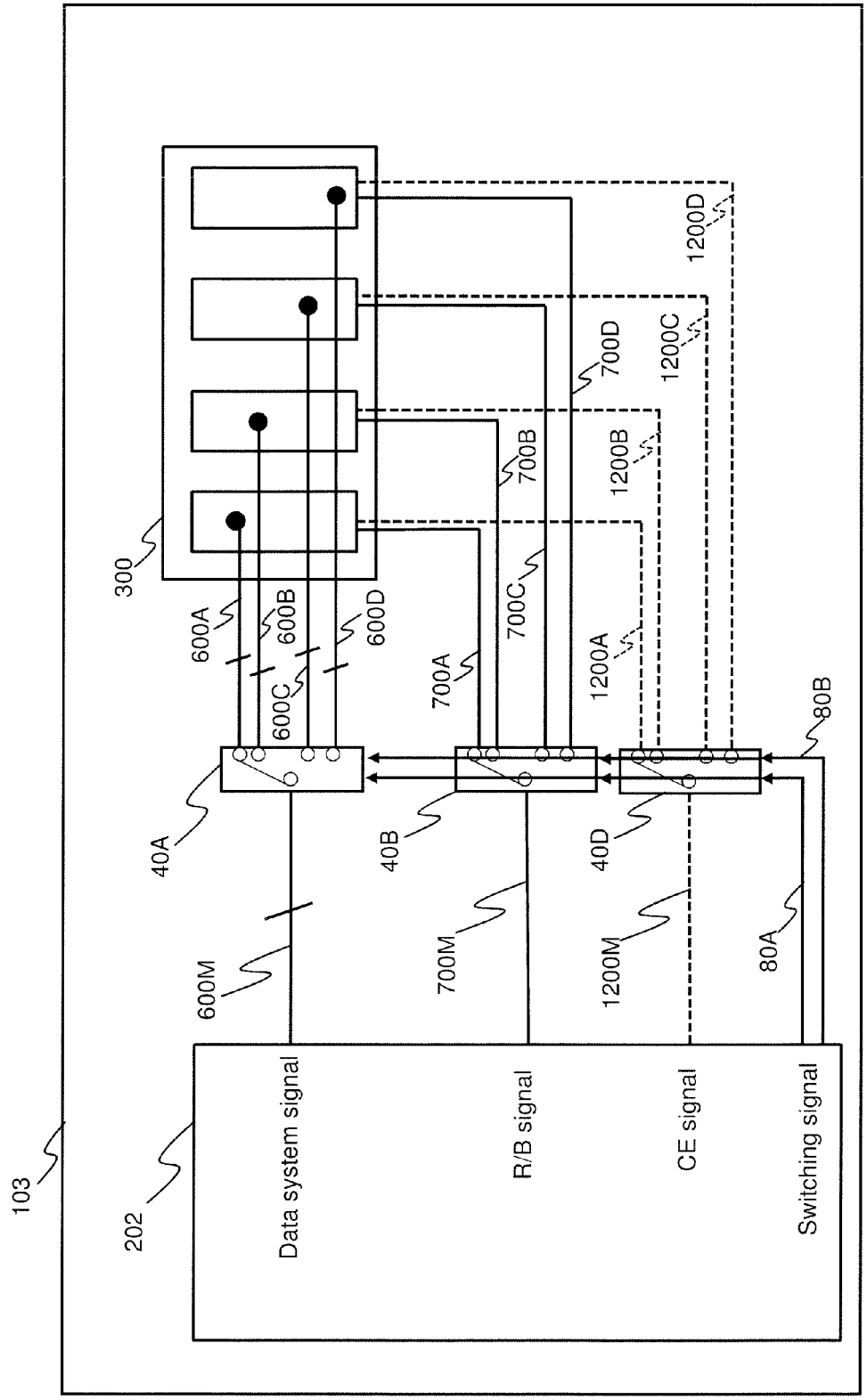
FIG. 6 illustrates an overview of an NVM device according to Embodiment 4.

FIG. 6 illustrates an overview of an NVM device according to Embodiment 4.

An NVM device 103 according to Embodiment 4 includes the switching circuit 40A for the data system signal and the switching circuit 40B for the R/B signal, and further includes a switching circuit (an example of a second switching circuit for selection) 40D for the CE signal. A common switching signal is used for the switching circuits 40A, 40B and 40D. The switching circuit 40D also corresponds to (1:m) branching with m not being limited to 4. A CE signal line 1200M from a controller 202 is branched by the switching circuit 40D for the CE signal into four CE signal lines 1200A to 1200D that are respectively coupled to the chips 61A to 61D. The CE signal may be referred to as a CS signal.

In Embodiment 4, the number of CE signal lines is reduced by the switching circuit 40D, and thus the total number of signal lines can be further reduced, without increasing the number of switching signal lines because the common switching signal, used for the switching circuits 40A and 40B, is also used for the switching circuit 40D.

[Embodiment 5]

Embodiment 5 is described. The difference from Embodiment 4 is mainly described, and the points that are the same as Embodiment 4 are not described or briefly described.

Figure 7:
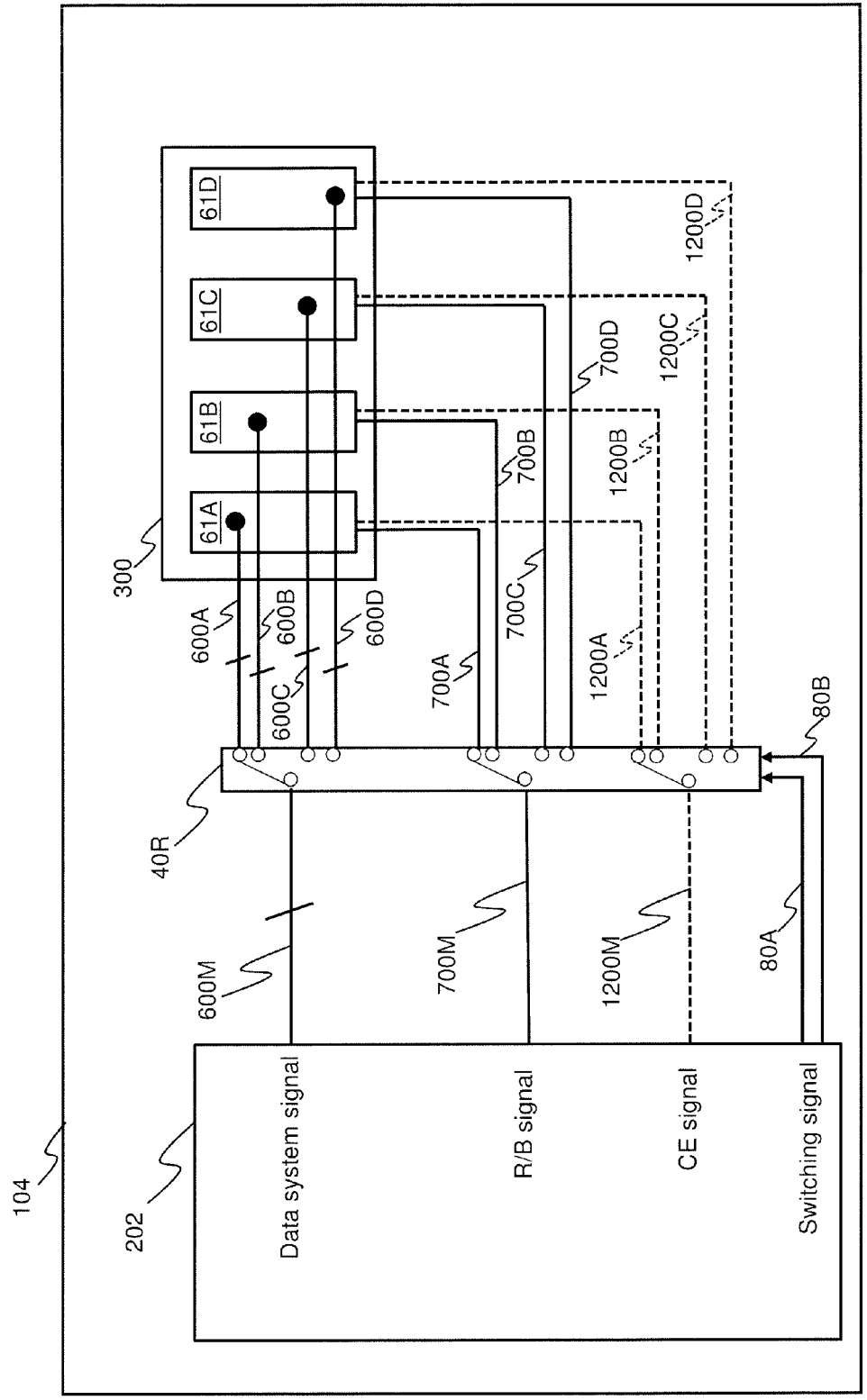
FIG. 7 illustrates an overview of an NVM device according to Embodiment 5.

FIG. 7 illustrates an overview of an NVM device according to Embodiment 5.

An NVM device 104 according to Embodiment 5 includes a common (single) switching circuit 40R serving as the switching circuits 40A, 40B and 40D. In other words, the switching circuits 40A, 40B and 40D are each a part of the single switching circuit 40R. The switching circuit 40R also corresponds to (1:m) branching with m not being limited to 4.

In Embodiment 5, the packaging area of the switching circuit can be reduced, and the number of components mounted on the NVM device 104 can be reduced.

The switching circuit 40R may have the same size as each of the switching circuits 40A and 40B. For example, the switching circuits 40A, 40B, 40D and 40R may be the same parts.

[Embodiment 6]

Embodiment 6 is described. The difference from Embodiments 1 to 5 is mainly described, and the points that are the same as Embodiments 1 to 5 are not described or briefly described.

Figure 8:
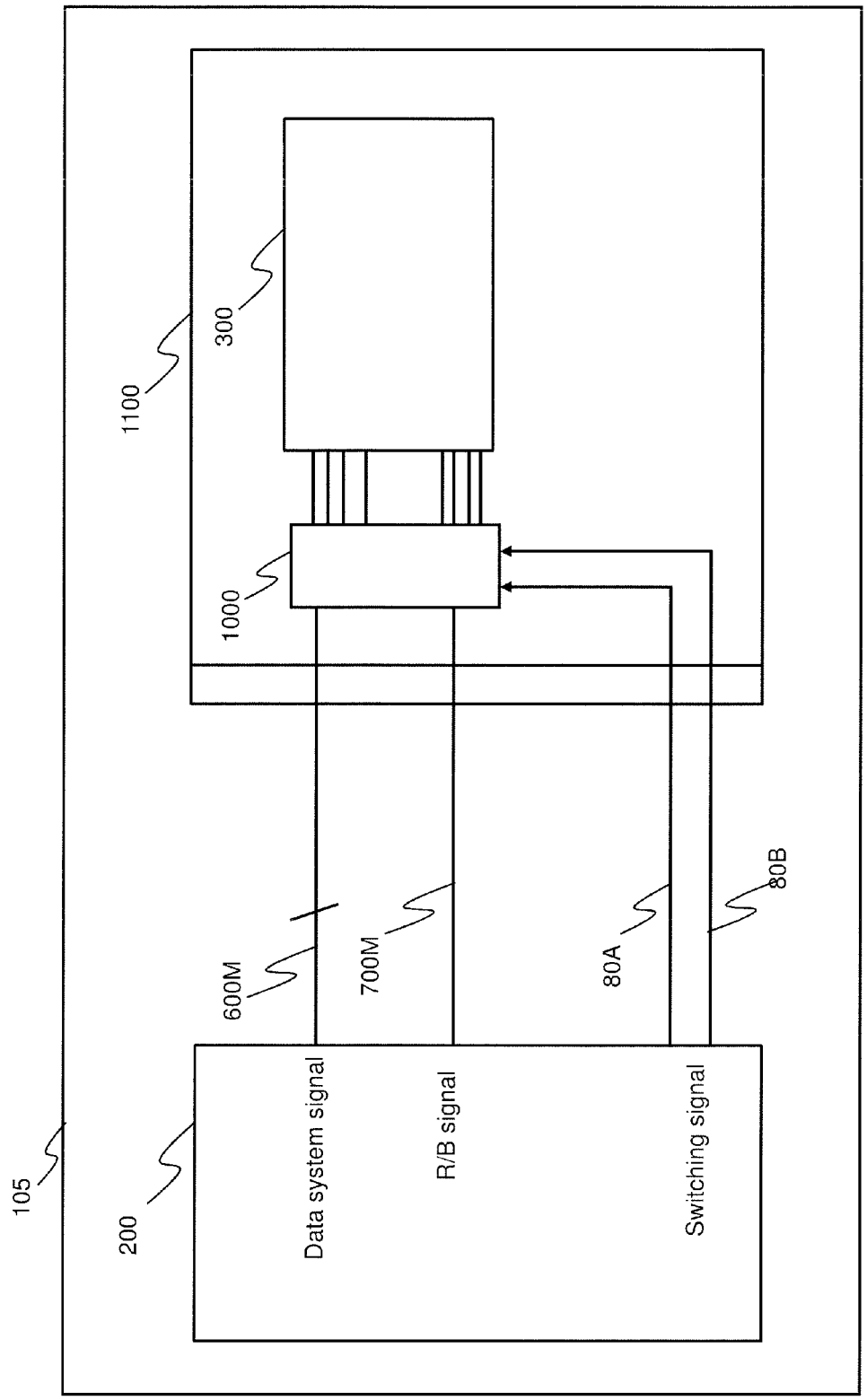
FIG. 8 illustrates an overview of an NVM device according to Embodiment 6.

FIG. 8 illustrates an overview of an NVM device according to Embodiment 6.

An NVM device 105 according to Embodiment 6 includes an NVM module (for example, DIMM (dual inline memory module) substrate) 1100 and a module connector 1000.

The NVM module 1100 is a package including the switching circuit 40S and the NVM 300, and may be detachably attached to the module connector 1000. The switching circuit 40S is a switching circuit in which the switching circuits 40A and 40B are integrated as in Embodiment 2.

In Embodiment 6, the number of pins allocated to signals, in pins of the connector 1000 with which the NVM module 1100 is coupled, can be reduced. Thus, the number of pins for power supply and ground can be increased. As a result, an improved power supply quality and signal quality can be expected.

[Embodiment 7]

Embodiment 7 is described. The difference from Embodiment 1 is mainly described, and the points that are the same as Embodiment 1 are not described or briefly described.

Figure 9:
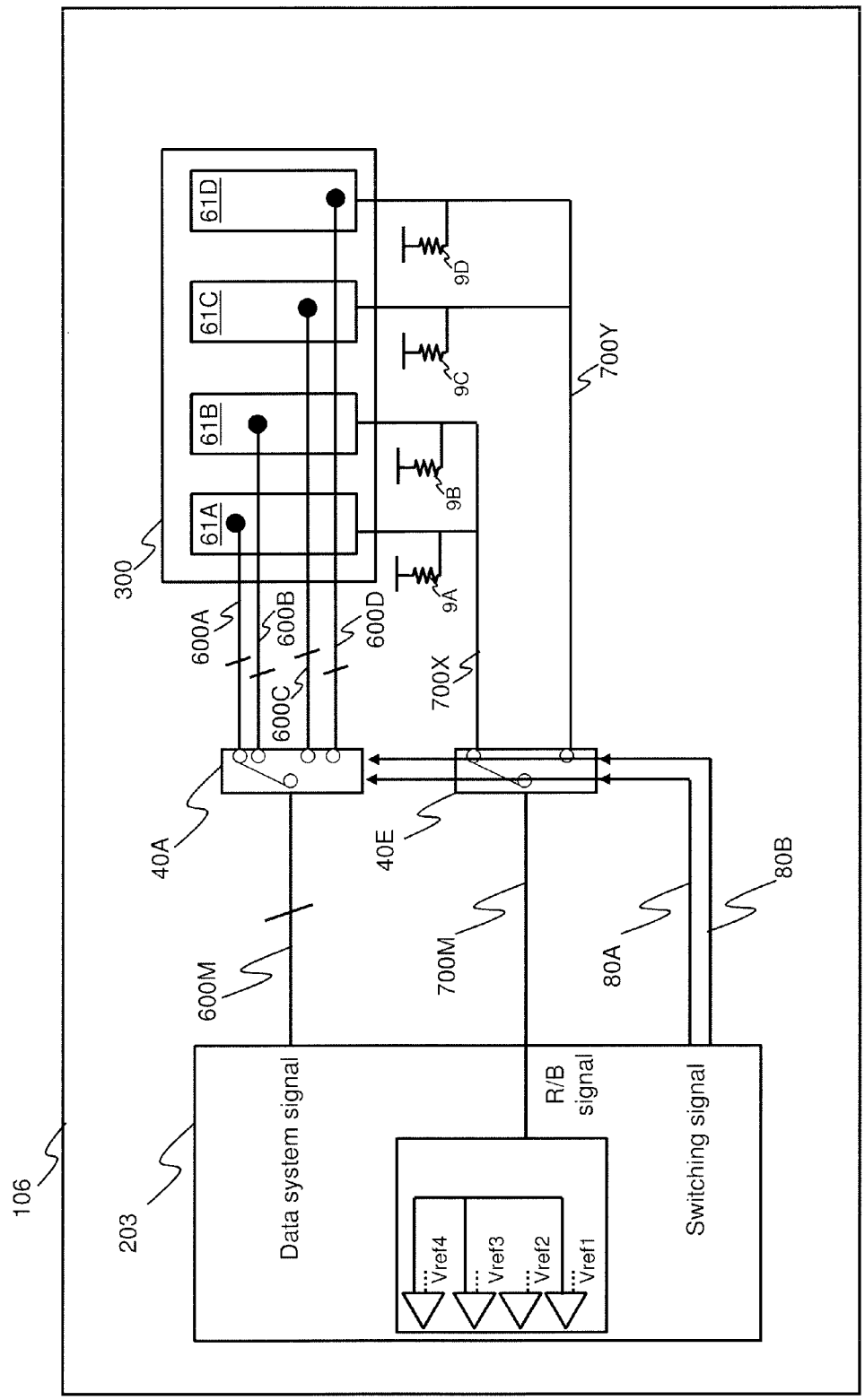
FIG. 9 illustrates an overview of an NVM device according to Embodiment 7.

FIG. 9 illustrates an overview of an NVM device according to Embodiment 7.

An NVM device 106 according to Embodiment 7 includes a second switching circuit 40E corresponding to (1:m) branching with the value m being smaller than the number of chips corresponding to the same switching signal. In other words, the number of chips the switching signal corresponding to the same switching signal is larger than the value m. Thus, at least one coupling destination of the second switching circuit 40E includes two or more chips. For example, in the present embodiment, the number of chips using the common switching signal is four, and the value m is two. Thus, the number of coupling destination chips of the second switching circuit 40E is two. In Embodiment 1, the two R/B signal lines 700A and 700B, independent from each other before reaching the second switching circuit 40B, are integrated into a single R/B signal line 700X to be coupled to the second switching circuit 40E. Similarly, in Embodiment 1, the two R/B signal lines 700C and 700D, independent from each other before reaching the second switching circuit 40B, are integrated into a single R/B signal line 700Y to be coupled to the second switching circuit 40E.

Thus, in Embodiment 7, pullup resistors 9A to 9D are respectively provided to the chips 61A to 61D. The pullup resistors 9A to 9D respectively have resistance values R1 to R4. Thus, a multi-level R/B signal, indicating more than simple ON/OFF, is input to the controller 203 through the R/B signal line 700M. The resistance values R1 to R4 are different values. Thus, the controller 203 receives an R/B signal with four signal levels. More specifically, for example, when the coupling destination of the switching circuit 40E is the chips 61A and 61B, the R/B signal received by the controller 203 has one of the following four signal levels (X1) to (X4):

(X1) both the chip 61A and the chip 61B are in the ready state;
(X2) only the chip 61A is in the busy state;
(X3) only the chip 61B is in the busy state; and
(X4) both the chip 61A and the chip 61B are in the busy state.

Some of the resistance value R1 to R4 may be of the same resistance value. Still, the number of the pullup resistors with the same resistance value cannot exceed m. The pullup resistors with the same resistance value are coupled to different ports (pins) of the second switching circuit 40E. This is because when the pullup resistors with the same resistance value are coupled to the same port (pin), the chip cannot be uniquely identified by the controller 203 by comparing the received R/B signal with reference voltage (described in detail below).

The controller 203 includes different signal reference voltages Vref1 to Vref4 respectively corresponding to the different resistance values R1 to R4. When the resistance values R1 to R4 include the same resistance value, the number of included reference voltages may be reduced accordingly.

The controller 203 executes the operation state check processing (for example, the initial check processing or the ready return check processing) on the coupling destination of the switching circuit 40E (and 40A). For example, the operation state check processing executed by the controller 203 includes the following (a) to (c):

(a) for example, a selected reference voltage is compared with a signal level (voltage level) of the received R/B signal;
(b) when the chip as the coupling destination of the switching circuit 40E and the operation state of the chip can be identified from the result of the comparison (a) (for example, when one of (X1) to (X4) described above can be identified), the operation check processing is terminated; and
(c) when the chip as the coupling destination of the switching circuit 40E and the operation state of the chip cannot be identified from the result of the comparison (a), the selected reference voltage is switched, and the processing returns to (a). For example, when the condition in (b) is satisfied, the controller 203 switches the coupling destination of the switching circuit 40E (and 40A), and may start the operation state check processing including (a) to (c) described above on the coupling destination chip, as a result of the switching.

In Embodiment 7, the signal lines can be reduced even when the number of chips, the switching signal for which is common, is larger than the number of branches (a value m) provided by the second switching circuit 40E.

[Embodiment 8]

Embodiment 8 is an example where the NVM device according to any one of Embodiments 1 to 7 is applied to at least one of a computer and a storage system.

Figure 10:
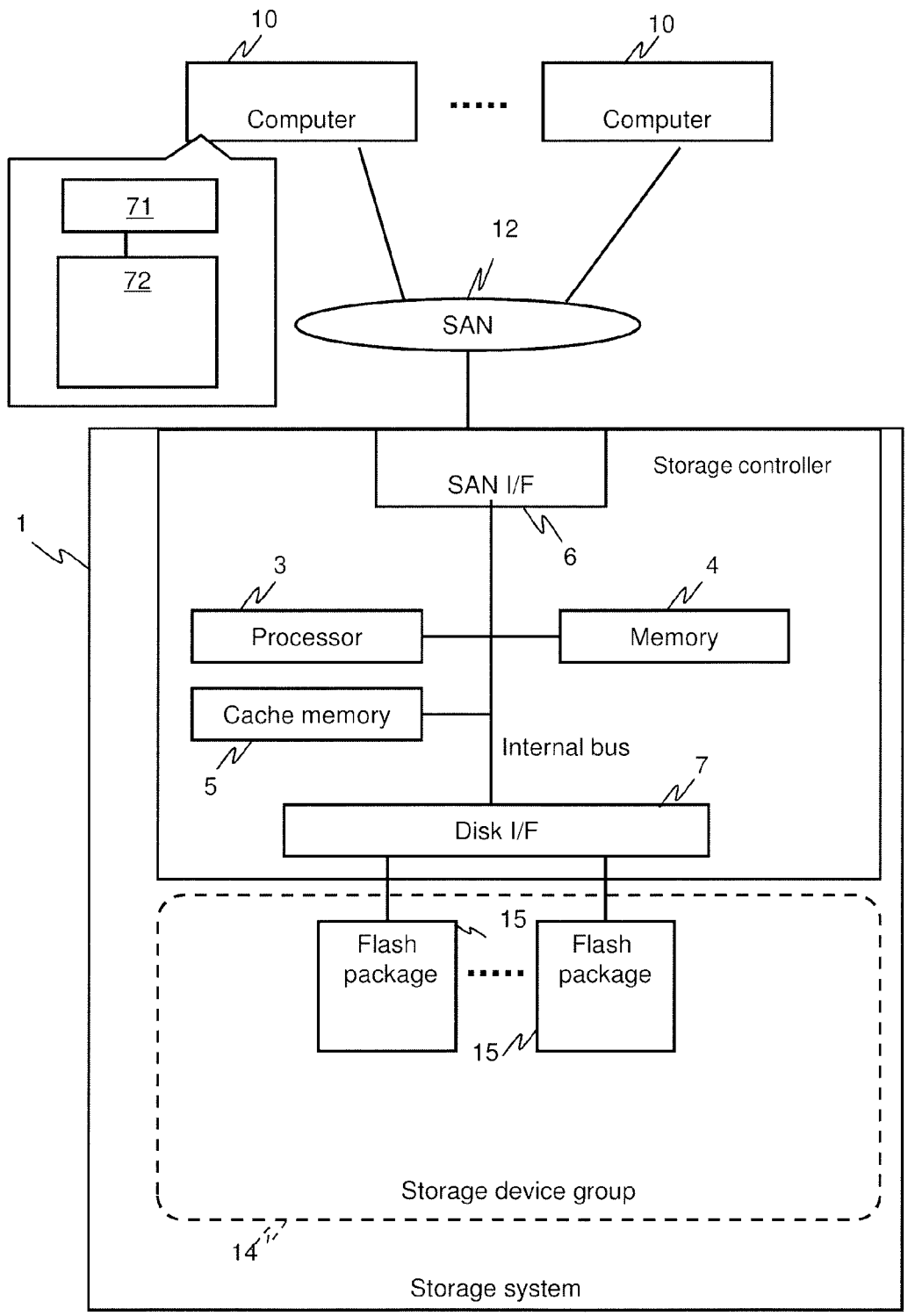
FIG. 10 illustrates a configuration of a computer system according to Embodiment 8.

FIG. 10 illustrates a configuration of a computer system according to Embodiment 8.

The computer system includes: a plurality of (or a single) computers 10; and a storage system 1 coupled to the computers 10. The computer 10 and the storage system 1 are coupled to each other via a communication network (for example a SAN (storage area network)) 12.

The computer 10 transmits an I/O request to the storage system 1. For example, at least one computer 10 may include: a communication interface device (I/F) (not illustrated) coupled to the SAN 12; an SSD (solid state drive) 72; and a processor 71 coupled to these components. The SSD 72 may be used as a main storage memory or an auxiliary storage device. The SSD 72 may be an example of a semiconductor memory device, and may be, for example, the NVM device in at least one of Embodiments 1 to 7. The processor 71 is an upper level device of the SSD 72.

The storage system 1 includes a storage controller 2 and a storage device group 14 coupled to the storage controller 2.

The storage device group 14 may include a RAID (redundant array of independent (or inexpensive) disks) group. The RAID group stores data in accordance with a predetermined RAID level. The storage device group 14 may include storage devices of different types, or may include storage devices of the same type. In the present embodiment, the storage device group 14 includes a plurality of flash packages 15. The flash package 15 may be an example of the semiconductor memory device, and may be, for example, the NVM device in at least one of Embodiments 1 to 7. The storage controller 2 is an upper level device of the flash package 15.

The storage controller 2 includes; a SAN I/F (interface device) 6 coupled to the SAN 12; a disk I/F 7 coupled to the storage device group 14; a memory 4; a cache memory 5; and a processor (for example, the CPU) 3 coupled to these components. The memory and the cache memory 5 may be integrally formed. At least one of the memory 4 and cache memory 5 may be an example of the semiconductor memory device and may be, for example, the NVM device in any one of Embodiments 1 to 7. The processor 3 is an upper level device of the memory 4 and the cache memory 5.

The storage controller 2 (processor 3) provides a logical volume to the computer 10, receives an I/O request (a write request or a read request) with the logical volume designated, from the computer 10, and, according to the received I/O request, performs data I/O for the logical volume. The storage controller 2 transmits a data write or read request to one or more flash packages 15 for performing data I/O for the I/O target data. The flash package 15 that has received the write or the read request executes the write processing or the read processing described above with reference to FIG. 2 and FIG. 3 for example.

Figure 11:
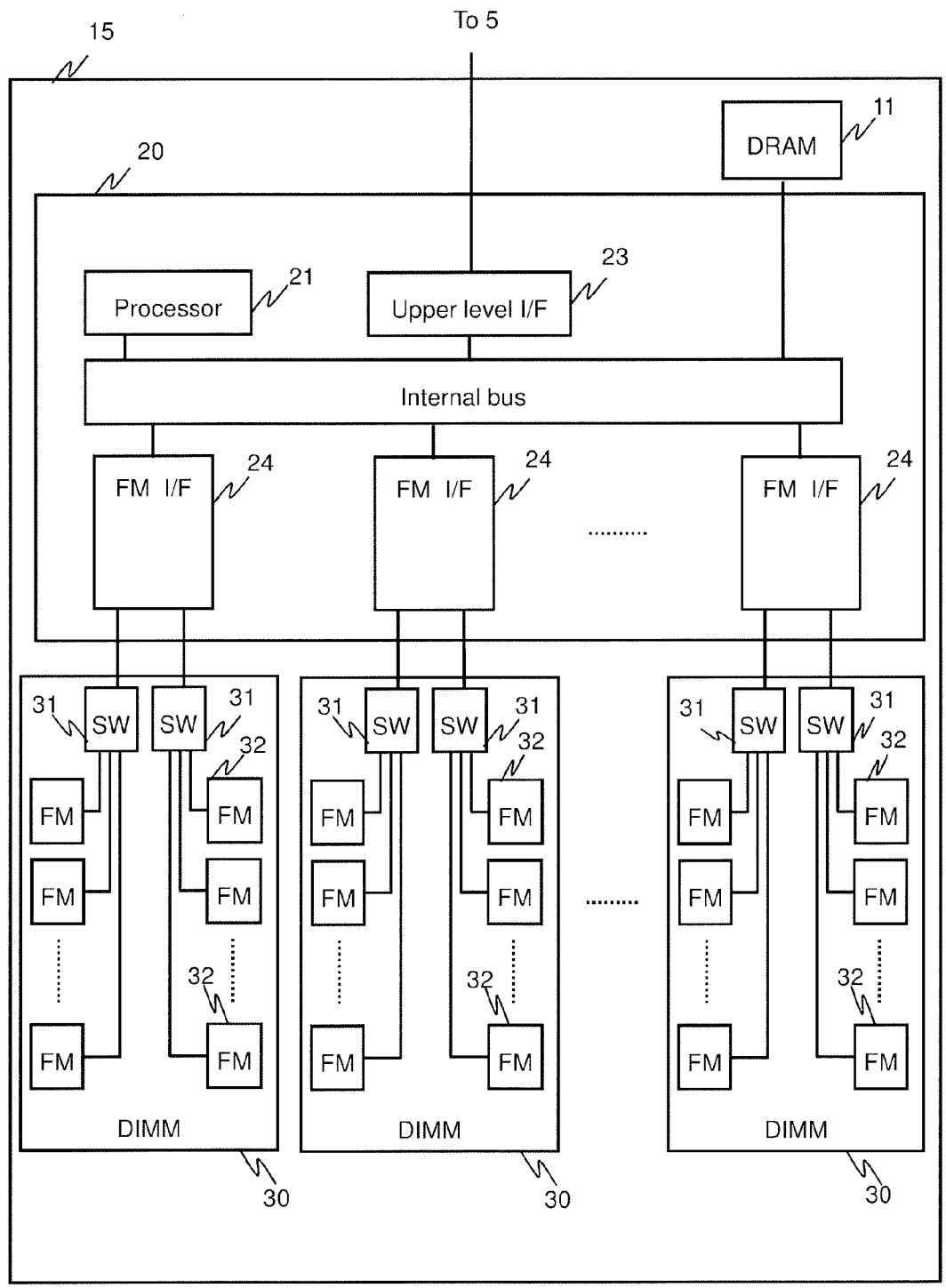
FIG. 11 illustrates a configuration of a flash package.

FIG. 11 illustrates a configuration of the flash package 15.

The flash package 15 includes a plurality of (or a single) DIMMs 30 and an FM controller 20 coupled to these. Each of the DIMMs 30 includes one or more SWs (switches) 31 and a plurality of FM (flash memory) chips 32. The SW 31 may be provided outside the DIMM 30. A single FM chip 32 is a single chip 61 in at least one of Embodiments 1 to 7. A single DIMM 30 or a group of two or more DIMMs 30 is a single NVM 300 in at least one of Embodiments 1 to 7. The FM controller 20 is a controller (memory controller) in according to at least one of Embodiments 1 to 7. For example, the FM chip 32 includes a plurality physical blocks. Each physical block includes a plurality of physical pages. Erasing is performed on a block-by-block basis, and I/O is performed on a page-by-page basis. Thus, the FM chip 32 is a NAND FM chip. Each cell in the FM chip 32 may be an SLC (single level cell) or an MLC (multi level cell).

The FM controller 20 includes: an upper level I/F 23 coupled to the storage controller 2; a plurality of FM I/Fs 24 coupled to the plurality of DIMMs 30; a DRAM 11; and a processor (for example, a CPU) 21 coupled to these components. The DRAM 11 stores therein various programs and information for managing the flash package 15. The processor 21 can implement various functions by executing a program based on the information stored in the DRAM 11.

The FM I/F 24 is coupled to the SW 31, and the SW 31 is coupled to the plurality of FM chips 32 mounted on the DIMM 30. The FM I/F 24 uses the CE signal to independently control each of the plurality of FM chips 32. The FM I/F 24 operates in accordance with a read/write request from the processor 21.

In Embodiment 8, at least one of Embodiments 1 to 7 may be applied to a signal line between the FM I/F 24 and the FM chip 32. For example, when Embodiment 1 is applied, the switching circuits 40A and 40B are disposed between the FM I/F 24 and the FM chip 32. For example, the SW 31 may be the switching circuits 40A and 40B. The FM chips 32 controlled by the common switching signal are coupled to the SW 31 the coupling destination of which is switched by the common switching signal. Two or more SWs 31 may share the switching signal.

The present invention is not limited to some embodiments described above, and may include various modifications. For example, the embodiments described above are described in detail for the sake of description of the present invention, and the present invention is not necessarily limited to a mode including all the above-described configurations. A configuration of one embodiment may be partially replaced with a configuration of another embodiment. Furthermore, a configuration of one embodiment may be added to a configuration of another embodiment. For apart of a configuration of each embodiment, adding, deleting, and replacing of another configuration may be performed. Two or more of Embodiments 1 to 8 may be combined.

For example, components, such as a signal line, described herein are components regarded as being necessary for the description. In other words, these components do not necessarily represent all the components required to form a product.

For example, in Embodiment 2, Embodiment 5, and Embodiment 6, a single circuit to which two or more types of signal lines are coupled is employed instead of two or more switching circuits corresponding to two or more types of signal lines respectively. Alternatively, a single switching circuit may logically (virtually) include two or more switching circuits corresponding to two or more types of signal lines respectively.

REFERENCE SIGNS LIST

100, 101, 102, 103, 104, 105, 106 NVM device

The invention claimed is:

1. A semiconductor memory device comprising:
   a semiconductor memory that includes a plurality of semiconductor memory portions;
   a memory controller that is configured to control the semiconductor memory;
   a first switching circuit that is coupled to the plurality of semiconductor memory portions and to the memory controller, and with which a data system signal line between the plurality of semiconductor memory portions and the memory controller is branched; and
   a second switching circuit that is coupled to the plurality of semiconductor memory portions and the memory controller, and with which a non-data system signal line between the plurality of semiconductor memory portions and the memory controller is branched,
   the first and second switching circuits being configured to share a switching signal for switching a coupling destination of a switching circuit,
   the non-data system signal line for each of the plurality of semiconductor memory portions is a signal line, in which a signal that indicates an operation state of the semiconductor memory portion and that is received by the memory controller is transmitted,
   in a case where the coupling destination of the first and second switching circuits is a first semiconductor memory portion that is one of the plurality of semiconductor memory portion, the first semiconductor memory portion is a transmission destination, and a command wait state has been detected with respect to the first semiconductor memory portion, the memory controller is configured to:
      wait for detection of transition of the first semiconductor memory portion to a processing in-progress state based on a received operation state signal, after transmission of a data system signal to the first semiconductor memory portion; and
      switch the coupling destination of the first and second switching circuits to any of the semiconductor memory portions other than the first semiconductor memory portion by using the switching signal, after detecting the transition of the first semiconductor memory portion to the processing in-progress state.

2. The semiconductor memory device according to claim 1, wherein
   when the transition of the first semiconductor memory portion to the command wait state is not detected after the transition of the first semiconductor memory portion to the processing in-progress state has been detected, the memory controller is configured to:
      switch the coupling destination of the first and second switching circuits to the first semiconductor memory portion by using the switching signal, and
      check whether a received operation state signal has returned to the command wait state.

3. The semiconductor memory device according to claim 2, wherein
   the transmission of the data system signal to the first semiconductor memory portion is transmission of a read command,
   the memory controller is configured to switch the coupling destination of the first and second switching circuits to any of the semiconductor memory portions other than the first semiconductor memory portion, after detecting the transition of the first semiconductor memory portion to the processing in-progress state, and
   the memory controller is configured to receive data, which is a target of the read command, from the first semiconductor memory portion, when the returning of the semiconductor memory portion to the command wait state has been detected, after the coupling destination of the first and second switching circuits has been switched to the first semiconductor memory portion.

4. The semiconductor memory device according to claim 1, wherein the first and second switching circuits form a single switching circuit.

5. The semiconductor memory device according to claim 1, wherein
the second switching circuit is an analog switching circuit,
the memory controller includes a pullup resistor for the non-data system signal line coupled to the memory controller, and
the memory controller is incorporated with the pullup resistor.

6. The semiconductor memory device according to claim 1, wherein
an operation state signal line and a selection signal line are provided as a plurality of types of the non-data system signal lines for the plurality of semiconductor memory portions,
the operation state signal line is a signal line in which an operation state signal, which is a signal indicating the operation state of the semiconductor memory portions and which is a signal received by the memory controller, is transmitted,
the selection signal line is a signal line in which a selection signal, which is a signal for selecting the semiconductor memory portions and which is a signal transmitted by the memory controller, is transmitted,
as the second switching circuit, there are provided a state second switching circuit serving as a second switching circuit for the operation state signal line and a selection second switching circuit serving as a second switching circuit for the selection signal line, and
the first switching circuit, the state second switching circuit, and the selection second switching circuit share the switching signal.

7. The semiconductor memory device according to claim 6, wherein the first switching circuit, the state second switching circuit, and the selection second switching circuit form a single switching circuit.

8. The semiconductor memory device according to claim 1, further comprising:
a module connector coupled to the memory controller; and
a semiconductor memory module detachably attached to the module connector, wherein
the semiconductor memory module includes the first switching circuit, the second switching circuit, and the semiconductor memory.

9. The semiconductor memory device according to claim 1, wherein
the number of semiconductor memory portions that correspond to the same switching signals and are coupled to the second switching circuit is larger than the number of branches provided by the second switching circuit,
the semiconductor memory device further comprises a plurality of pullup resistors for the plurality of respective semiconductor memory portions,
from among the plurality of pullup resistors the number of pullup resistors with a same resistance value is not larger than the number of branches provided by the second switching circuit,
two or more of the semiconductor memory portions having the pullup resistors with different resistance values are coupled to a pin of the second switching circuit, and the memory controller identifies operation states of two or more of the semiconductor memory portions, which are the coupling destinations of the first and second switching circuits, based on a signal level of a received operation state signal.

10. A storage system comprising:
a plurality of semiconductor memory devices; and
a device controller configured to transmit an I/O request to each of the plurality of semiconductor memory devices,
the plurality of semiconductor memory devices each including,
a semiconductor memory including a plurality of semiconductor memory portions,
a memory controller configured to control the semiconductor memory,
a first switching circuit which is coupled to the plurality of semiconductor memory portions and to the memory controller and with which a data system signal line between the plurality of semiconductor memory portions and the memory controller is branched, and
a second switching circuit which is coupled to the plurality of semiconductor memory portions and to the memory controller and with which a non-data system signal line between the plurality of semiconductor memory portions and the memory controller is branched, and
in each of the one or more semiconductor memory devices, the first and second switching circuits being configured to share a switching signal for switching a coupling destination of a switching circuit,
in each of the one or more semiconductor memory devices, the non-data system signal line for each of the plurality of semiconductor memory portions is a signal line, in which a signal that indicates an operation state of the semiconductor memory portion and that is received by the memory controller is transmitted,
in each of the one or more semiconductor memory devices, in a case where the coupling destination of the first and second switching circuits is a first semiconductor memory portion that is one of the plurality of semiconductor memory portions, the first semiconductor memory portion is a transmission destination, and a command wait state has been detected with respect to the first semiconductor memory portion, the memory controller is configured to:
wait for detection of transition of the first semiconductor memory portion to a processing in-progress state based on a received operation state signal, after transmission of a data system signal to the first semiconductor memory portion; and
switch the coupling destination of the first and second switching circuits to any of the semiconductor memory portions other than the first semiconductor memory portion by using the switching signal, after detecting the transition of the first semiconductor memory portion to the processing in-progress state.

11. A computer comprising:
a semiconductor memory device; and
a processor configured to transmit an I/O request to the semiconductor memory device,
the semiconductor memory device including,
a semiconductor memory including a plurality of semiconductor memory portions,
a memory controller configured to control the semiconductor memory, a first switching circuit which is coupled to the plurality of semiconductor memory portions and to the memory controller, and with which a data system signal line between the plurality of semiconductor memory portions and the memory controller is branched, and a second switching circuit which is coupled to the plurality of semiconductor memory portions and the memory controller, and with which a non-data system signal line between the plurality of semiconductor memory portions and the memory controller is branched, and in the semiconductor device, the first and second switching circuits being configured to share a switching signal for switching a coupling destination of a switching circuit, in the semiconductor memory device, the non-data system signal line for each of the plurality of semiconductor memory portions is a signal line, in which a signal that indicates an operation state of the semiconductor memory portion and that is received by the memory controller is transmitted, in the semiconductor memory device, in a case where the coupling destination of the first and second switching circuits is a first semiconductor memory portion that is one of the plurality of semiconductor memory portions, the first semiconductor memory portion is a transmission destination, and a command wait state has been detected with respect to the first semiconductor memory portion, the memory controller is configured to:

wait for detection of transition of the first semiconductor memory portion to a processing in-progress state based on a received operation state signal, after transmission of a data system signal to the first semiconductor memory portion; and switch the coupling destination of the first and second switching circuits to any of the semiconductor memory portions other than the first semiconductor memory portion by using the switching signal, after detecting the transition of the first semiconductor memory portion to the processing in-progress state.

* * * * *